US009100760B2

(12) United States Patent
Tackett

(10) Patent No.: US 9,100,760 B2
(45) Date of Patent: Aug. 4, 2015

(54) AUDIO CHANNEL FAULT DETECTION SYSTEM

(75) Inventor: Jeffrey Tackett, Allen Park, MI (US)

(73) Assignee: Harman International Industries, Inc., Stamford, CT (US)

( * ) Notice: Subject to any disclaimer, the term of this patent is extended or adjusted under 35 U.S.C. 154(b) by 348 days.

(21) Appl. No.: 13/541,431

(22) Filed: Jul. 3, 2012

(65) Prior Publication Data

US 2013/0294609 A1 Nov. 7, 2013

Related U.S. Application Data

(60) Provisional application No. 61/642,708, filed on May 4, 2012.

(51) Int. Cl.

*H03G 11/00* (2006.01)
*H04R 29/00* (2006.01)
*H04R 3/00* (2006.01)

(52) U.S. Cl.

CPC .............. *H04R 29/007* (2013.01); *H04R 3/007* (2013.01)

(58) Field of Classification Search

CPC ..................... H04R 3/00; H04R 3/007; H04R 29/00–29/006; H04R 29/007; H02H 1/0015; H02H 1/04; H02H 3/44

USPC ................ 381/56, 58, 120, 55, 189; 324/500, 324/509–511, 555

See application file for complete search history.

(56) References Cited

U.S. PATENT DOCUMENTS

| | | | | |
|---|---|---|---|---|
| 4,081,829 | A * | 3/1978 | Brown | 381/56 |
| 5,311,138 | A | 5/1994 | Ott et al. | 324/503 |
| 5,467,240 | A | 11/1995 | Williamson et al. | 361/18 |
| 5,623,254 | A | 4/1997 | Brambilla et al. | 340/644 |
| 5,896,057 | A | 4/1999 | Chicca et al. | 327/423 |
| 7,521,936 | B2 | 4/2009 | Stanley | 324/522 |
| 2005/0057261 | A1 * | 3/2005 | Hale et al. | 324/536 |
| 2006/0109009 | A1 * | 5/2006 | Banke et al. | 324/536 |
| 2007/0153780 | A1 * | 7/2007 | Stanley | 370/360 |
| 2007/0252603 | A1 * | 11/2007 | Restrepo et al. | 324/536 |
| 2009/0108967 | A1 * | 4/2009 | Parker | 335/20 |
| 2010/0097733 | A1 * | 4/2010 | E. | 361/42 |
| 2012/0268974 | A1 * | 10/2012 | Fattal et al. | 363/81 |
| 2013/0070930 | A1 * | 3/2013 | Johnson | 381/57 |

* cited by examiner

*Primary Examiner* — Xu Mei
(74) *Attorney, Agent, or Firm* — Brooks Kushman P.C.

(57) ABSTRACT

An audio system includes a diagnostic capability to check for faults to a power source and faults to ground for output audio channels configured to drive loudspeakers. The fault to ground analysis involves analysis of a number of digital samples to determine if a predetermined threshold is exceeded during a predetermined period of time. The analysis may involve both a digital signal processor and a microprocessor performing a zero crossing analysis using the predetermined threshold and the predetermined window of time.

21 Claims, 9 Drawing Sheets

AUDIO CHANNEL FAULT DETECTION SYSTEM

CROSS-REFERENCE TO RELATED APPLICATIONS

This application claims the benefit of U.S. provisional application Ser. No. 61/642,708 filed May 4, 2012, the disclosure of which is hereby incorporated in its entirety by reference herein.

BACKGROUND OF THE INVENTION

1. Technical Field

The present invention relates to audio systems, and more particularly to an audio channel fault detection system for use with an audio system.

2. Related Art

Audio systems typically include a source of audio content such as an audio file, compact disc player, or digital video disc (DVD) player that provides an audio signal, an amplifier to amplify the audio signal, and one or more loudspeakers driven by the amplifier to produce the audio signal as audible sound. The amplifier and loudspeakers are typically interconnected with wiring to transmit the amplified audio signals. The amplified audio signals can be high electrical current and/or voltage signals. When the circuit between the amplifier and loudspeakers is compromised, such as by damage to the wiring, a short to ground, or a short to a power supply of the audio system a fault may occur. Under fault conditions, faulty operation and/or damage to the audio system may result.

SUMMARY

An audio system may perform audio channel fault detection during a monitoring period, such as during startup, or during operation, of a power amplifier included in the audio system. The fault detection may involve monitoring a feedback current signal representative of an output electrical current present on respective output audio channels of the power amplifier. Detection of a ground fault may be based on the feedback current signal being outside a predetermined threshold for a predetermined period of time during the monitoring period.

The fault detection may be performed by a signal processor that includes a microprocessor performing logic based functionality in cooperative operation with a digital signal processor performing sampling based functionality. The sampling based functionality may involve sample-by-sample analysis of the feedback current signal to identify zero crossings of an alternating electrical current wave form representative of the feedback current signal. Sampling functionality may also involve tracking and storing a number of samples representing an electrical current on the audio output channels during a monitoring period, such as during the startup of the power amplifier or operation of the power amplifier. The number of zero crossings during the monitoring period may be used to determine if a fault to ground exists.

The predetermined period of time may be long enough to avoid false detection of a ground fault during other operational events occurring in the audio system. The predetermined threshold may be a parameter used in conjunction with the predetermined period of time to identify an electrical current event on one or more output audio channels. In addition, during the predetermined period of time, while the feedback current is outside the predetermined threshold, a length of time between zero crossings, or a number of zero crossings among the samples may be determined and stored. A number of samples representing the initiation of the electrical current event to the conclusion of the electrical current event may be stored to identify the predetermined window of time, and the length of time between zero crossings or the number of zero crossings indicated within the number of samples may be confirmed as being below a predetermined threshold to indicate that the electrical current event is a short to ground event.

Alternatively, or in addition, the predetermined threshold may be used to trigger a count of samples of the alternating electrical current on the audio channels that is outside the predetermined threshold using a local counter. The local counter may count samples of the electrical current until a zero crossing of the alternating electrical current is detected, at this time the local counter may be reset. Prior to reset, a count value in the local counter may be compared to a maximum count register value. If the local counter value exceeds the maximum count register value, the maximum count register value may be updated with the count value from the local counter. The maximum count register value may be compared to a threshold value representing the predetermined period of time. If the maximum count register exceeds the threshold value, a short to ground event is indicated.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
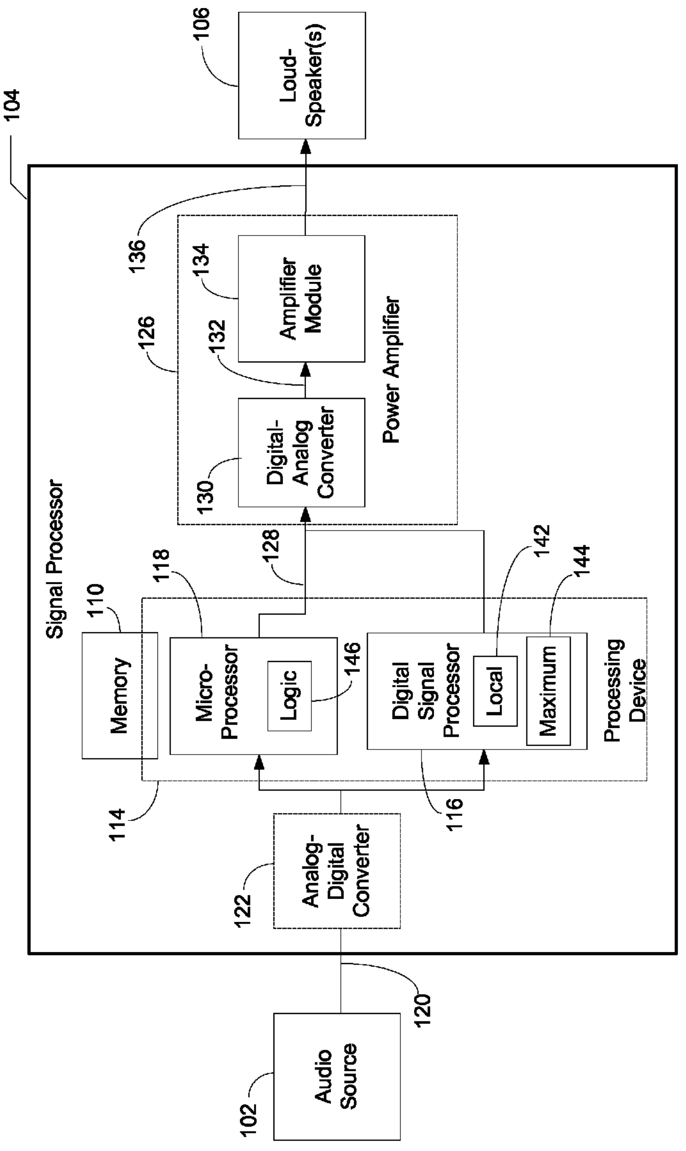
FIG. 1 is a block diagram of an example audio system.

FIG. 1 is a block diagram of an example audio system 100 that includes an audio source 102, a signal processor 104, and at least one loudspeaker 106. The audio system 100 may be any system capable of providing audio content such as a multimedia system in a vehicle. Examples of the audio source 102 include a compact disc player, a video disc player, a radio tuner, a navigation system, a mobile phone, a vehicle head unit, a wireless or wireline communication device, a personal computer, a multimedia memory storage device, such as an IPOD or MP3 player, or any other device capable of generating digital or analog audio signals representative of audio sound. In one example, the audio source 102 may provide digital audio input signals representative of left and right stereo audio input signals on left and right audio input channels. In other examples, the audio input signal may be analog signals. Alternatively, or in addition, the audio input signals may be received as microphone input signals, received as streaming audio signals over a network, such as the Internet, or be generated as live sound audio signals. The audio signal may include any number of channels, such as a mono audio input channel, seven audio input channels in Logic 7™ surround sound, or six audio channels in Dolby 5.1™ surround sound.

The signal processor 104 may be any computing device capable of processing audio and/or video signals, such as a computer processor, a digital signal processor, a microprocessor and the like. The signal processor 104 may operate in association with a memory 110 to execute instructions stored in the memory 110. The instructions may provide at least part of the functionality of the audio system 100. The memory 110 may be any form of one or more data storage devices, such as volatile memory, non-volatile memory, electronic memory, magnetic memory, optical memory, or any other form of non-transitory data storage mechanism or system. The memory 110 may store instructions and data. The data may be parameters used/updated during processing, parameters generated/updated during processing, user entered variables, and/or any other information related to processing audio signals.

The signal processor 104 may be one or more processing devices capable of performing logic to process the audio signals supplied on one or more audio channels from the audio source 102. Such processing devices may include digital signal processors (DSP), microprocessors, field programmable gate arrays (FPGA), or any other device(s) capable of executing instructions. In addition, the audio signal processor 104 may include other signal processing components such as filters, analog-to-digital converters (A/D), digital-to-analog (D/A) converters, signal amplifiers, decoders, delay, or any other audio processing mechanisms. The signal processing components may be hardware based, software based, or some combination thereof.

In FIG. 1, the signal processor 104 includes a processing device 114 in the form of a digital signal processor (DSP) 116 cooperatively operating with a microprocessor 118 to execute the instructions stored in the memory 110. In one example, the DSP 116 may be used for sampling the audio signal and performing audio signal related processing in the digital domain. The microprocessor 118 may perform logic based computations related to processing the audio signals. Audio signals received by the signal processor 104 on one or more audio channels 120 may be converted to the digital domain (if not received in digital form) using an analog-to-digital converter (ADC) 122 and provided to the microprocessor 118 and/or the DSP 116 for processing. The analog-to-digital converter 122 may be a separate device, or may be instructions executed by the processing device 114, and may include filtering to minimize or eliminate any direct current (DC) component included in the audio signals, since the audio signals are alternating electrical current signals. Processing by the processing device 114 may include equalization, audio signal modification, such as delay, phase adjustment, frequency based signal processing, routing or any other form of audio signal processing of the audio signals. Signal processing, such as filtering, noise compensation, loudness, buffering, or any other form of signal modification may also be performed in the signal processor 104 external to, internal to, or in conjunction with the processing device 114.

The signal processor 104 may also include a power amplifier 126. The power amplifier 126 may receive and amplify processed audio signals to increase the amplitude of the audio signals received. The processed audio signals may be supplied to the power amplifier 126 on a processed audio signal line 128. The processed audio signals may be digital audio signals. The digital audio signals may be converted to analog audio signals by a digital-to-analog converter (DAC) 130 and provided as digital processed audio signals on a digital processed audio signal line 132. Digital processed audio signals may be received and amplified by an amplifier module 134, and output as amplified audio output signals on output audio channels 136 to the one or more loudspeakers 106. The digital-to-analog converter 130 may be a separate device, or may be instructions executed by the processing device 114. Alternatively, analog processed audio signals may be supplied from the processing device 114, and the DAC 130 may be omitted. The amplifier module 134 may be any form of signal amplification device, such as a class D audio amplifier. In one example, the amplifier module 134 may be a power integrated circuit. The term "module" may be defined to include one or more executable modules. The modules are defined to include software, hardware or some combination thereof executable by the signal processor 104. Software modules may include instructions stored in the memory 110, or other memory device, that are executable by the signal processor 114 or other processor. Hardware modules may include various devices, components, circuits, gates, circuit boards, and the like that are executable, directed, and/or controlled for performance by the signal processor 114.

The one or more loudspeakers 106 may be any form of transducer device capable of translating electrical audio signals to audible sound. The loudspeaker 106 may be a group of loudspeakers 106 that are configured and located to operate individually or in groups, and may be in any frequency range. The one or more loudspeakers 106 may collectively or individually be driven by amplified output channels 136, or amplified audio channels, provided by the signal processor 104. The loudspeakers 106 may consist of a heterogeneous collection of audio transducers that receives a number of separate audio channels, such as stereo, 5 channel, 6 channel or seven channel audio signals. Each transducer may receive an independent and possibly unique amplified output audio signal from the signal processor 104. Accordingly, the audio system 100 may operate to produce mono, stereo, or surround sound signals using any number of loudspeakers 106.

In addition to processing audio signals, the signal processor 104 may also provide fault diagnostic testing of the output audio channels 136. The fault diagnostic testing may include 1) short-to-power source (STS) diagnostics; and 2) short to ground (STG) diagnostics. In the example of a vehicle, the power source is typically a DC (direct current) power source that includes a battery, however any power source may be present. Thus, in a short to power source (STS) scenario, the power source potential is typically the positive side of the power source. In addition, in the example of a vehicle, ground potential in a short to ground (STG) scenario is typically at the potential of the negative side of the power source. Faults in the form of STS and STG may occur anywhere from the output channels of the power amplifier 126 to include within the loudspeaker(s) 106 when an undesired electrically conductive path is formed to either the power source in an STS scenario, or to ground potential in an STG scenario.

Fault diagnostics to check for STS and STG may be performed using the signal processor 104 at the time the audio system 100 is initially energized using instructions from memory 110 executed by the processing device 114. Alternatively, or in addition, fault diagnostics may be performed during operation of the audio system 100 following startup. Accordingly, no dedicated or specialized integrated circuits or hardware devices are necessary for detecting fault conditions (STS or STG), since the fault diagnostics are performed by the processing device 114 using software stored in the memory 110. Although the remaining discussion will focus on a specific application, namely, an audio system in a vehicle, the features and functionality used herein may be applied in any other system that includes an audio source, an amplifier and loudspeakers.

Figure 2:
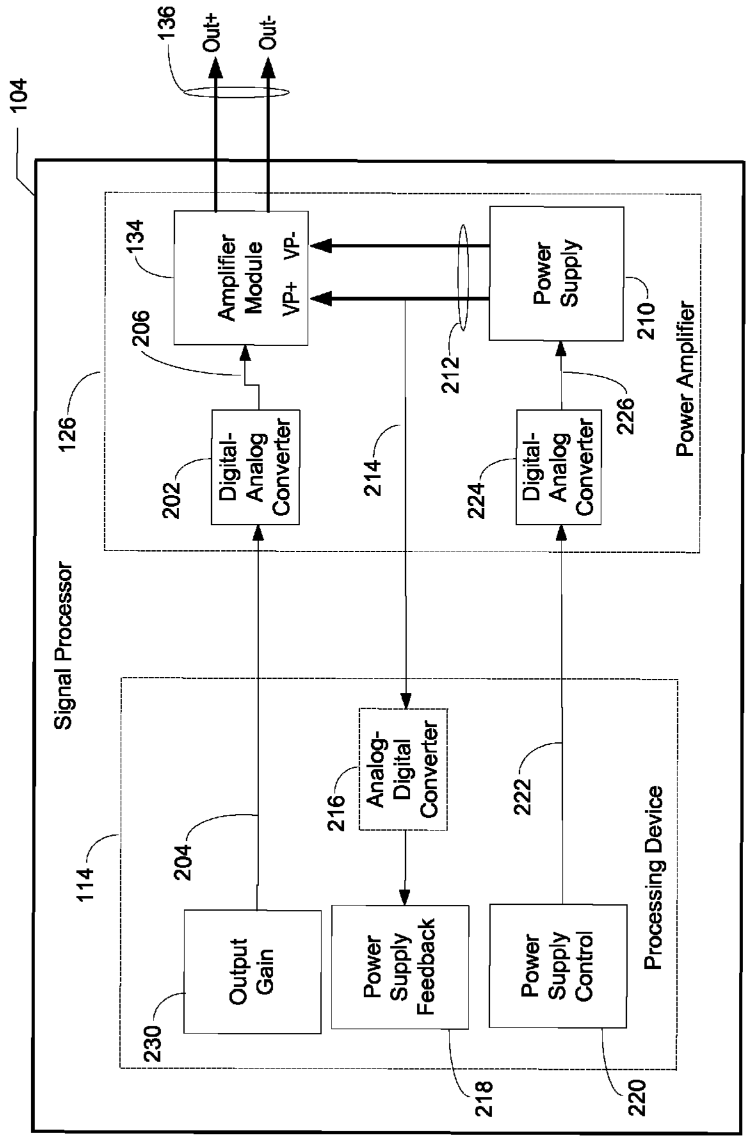
FIG. 2 is a block diagram of an example signal processor that may be included in the audio system of FIG. 1 to perform short to power source diagnostics.

FIG. 2 is a block diagram example of the signal processor 104 that includes a processing device 114 and a power amplifier 126. The power amplifier 126 may include an audio output channel DAC 202 that receives from the processing device 114 processed digital audio signals on a processed digital audio signal line 204, and provides processed analog audio signals on a processed audio analog audio signal line 206 to the amplifier module 134.

The amplifier module 134 may receive supply power (VP), such as +2.5VDC and −2.5VDC from a power supply 210 on power supply lines 212. In one example, the power supply 201 may be a tracking power supply that automatically adjusts an output voltage and electrical current of the power supply in response to the amplitude of the audio signals processed by the processing device 114. In addition, an indication of the output of the power supply 210 may be provided as a feedback signal to the processing device 114 on a feedback signal line 214 to an ADC 216, which may be internal or external to the processing device 114. In other examples, the feedback signal may be analog or digital, and no conversion may be needed. The feedback signal may be provided to a power supply feedback module 218.

The processing device 114 may also provide a digital power supply control signal from a power supply control module 220 on a power supply control line 222. The power supply control module 220 may be included in the processing device 114, and may control operation of the power supply 210. The digital power supply control signal may be converted to analog by a DAC 224, and provided as an analog power supply control signal on an analog power supply control signal line 226. In other examples, these signals may be analog or digital, and no conversion may be needed. The power supply control signal may control the voltage output of the power supply 210 based at least in part on the feedback signal. Alternatively, or in addition, where the power supply 210 is a tracking power supply with adjustable voltage and electrical current output, the power supply control signal may provide a control signal in accordance with the amplitude of the audio signals being processed and the feedback signal. The tracking power supply 210 of this example may adjust the output voltage and electrical current of the power supply 210 to track the amplification needs of amplifier module 134 during amplification of the audio signals based on the power supply control signal.

The amplifier module 134 may output audio output signals on one or more of the output audio channels 136, illustrated in FIG. 2 as a positive and a negative side of the output channel(s), based on the processed audio signal provided by the processing device 114. An output gain may be applied to the processed audio signal by an output gain module 230 to adjust the levels of the output audio signals where the power amplifier 126 has a predetermined fixed gain or amplification. Alternatively, the output gain module 230 may control the amount of gain or amplification applied to the output channels by the amplifier module 134, when the amplifier module 134 is capable of providing a variable gain or amplification of the output audio signals.

In FIG. 2, during example operation, the power supply control module 220 may control the power supply 210 using the power supply control signal to maintain the supply power (VP) at a predetermined voltage, such as 2.5VDC, using the feedback signal. During a monitoring period, which could be during operation or during a startup phase of the example audio system, such as when the vehicle is either started or placed in an accessories mode, the processing device 114 can mute the processed audio signals to reduce the output gain of the gain module 230 to zero thereby eliminating an audio output signal on the output audio channels 136 to drive the loudspeakers 106. During this time, as part of the STS and STG diagnostics, the processing device 114 may monitor the feedback signal for a possible STS fault in the form of a short to the power source of the audio system, or some other power source present in the vehicle. Alternatively, or in addition, the processing device 114 can perform the monitoring period during operation while the signal processor 104 is outputting an audio output signal on the output audio channels 136 to drive the loudspeakers 106.

Figure 3:
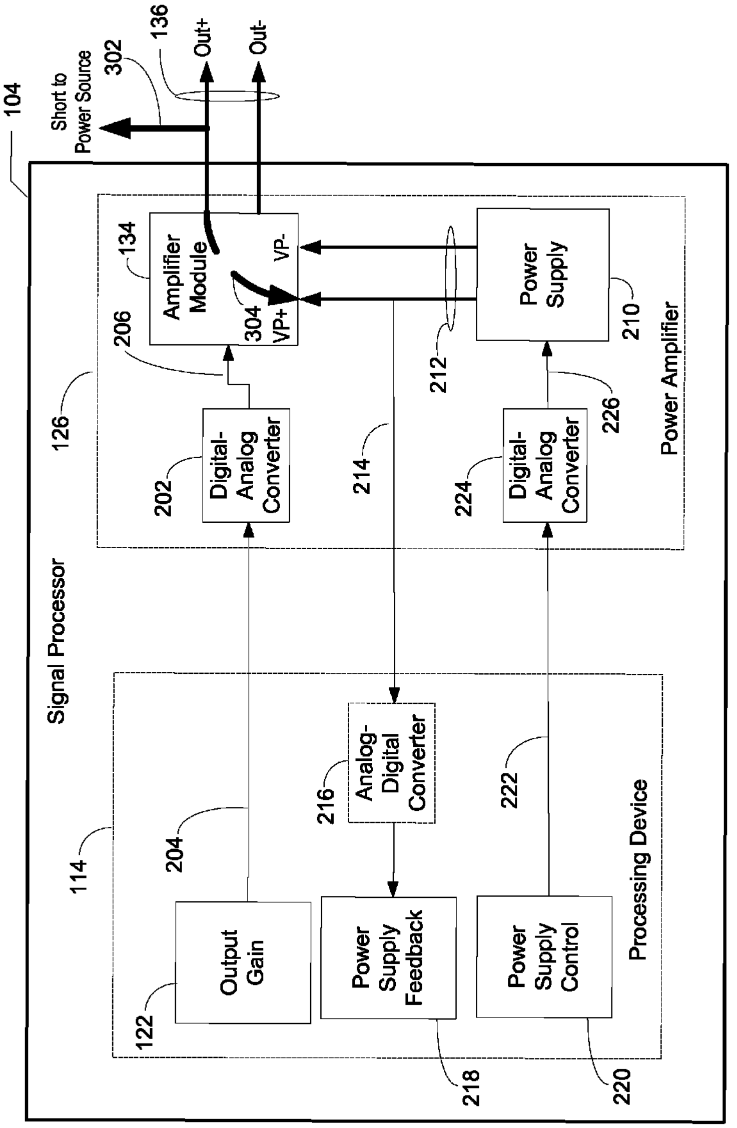
FIG. 3 is a block diagram of example operation of the signal processor included in FIG. 2 during an example short to power source event.

FIG. 3 illustrates an example STS fault scenario in which the positive side of the output channel 136 is electrically shorted to a power source of the audio system, such as a 12 VDC power source, by a shorting connection 302. During the monitoring period, such as the startup phase and/or the operational phase of the audio system, the signal processor 104 may perform fault diagnostics which include STS diagnostics. During the fault diagnostics testing for STS, the signal processor 104 may mute the processed digital audio signals on the processed digital audio signal line 204. Muting may involve reducing the gain of the processed digital audio signals to zero, attenuating the amplitude of the processed digital audio signals, or otherwise removing or minimizing all signals from the processed digital audio signal line 204. Since the processed audio signals are muted by the processing device 114, the potential of the positive side of the output audio channel 136 is raised to the potential of the power source, in this example 12 VDC. The raised potential of the output audio channel 136 may pass through the amplifier module 134, as illustrated by arrow 304 and be sensed by the processing device 114 as the feedback signal on the feedback signal line 214 exceeding a predetermined threshold such as 6.0VDC. Alternatively, the fault diagnostics may be performed during operation of the audio system without muting the processed digital audio signals.

In response, the processing device 114 may perform fault detection activities. In one example, fault detection activities may include disabling power supplied to the amplifier module 134, providing a diagnostics failure alarm and powering down the signal processor 104. The diagnostics failure alarm may include setting a diagnostic trouble code (DTC), sending an alarm indication, such as message displayed at a head unit of vehicle to seek dealer service, or any other indication of detection of a short to power source (STS) situation. If the voltage of the power source of the audio system does not pass through the amplifier module 134, such as in a case where the amplifier module 134 includes reverse voltage protection, the processing device 114 may sense the voltage at another location, such as on the output audio channels 136.

In the scenario of a short to ground (STG) fault, no electrical current and voltage are supplied to the audio system 100 from a power supply external to the audio system 100. Instead, excessive electrical current is drawn from the audio amplifier 100 resulting in large electrical current flow on the output audio channels 136. During operation of the audio system 100 in the absence of a short to ground situation, however, relatively high electrical current may flow depending on the level of amplification of the audio signals. Thus, to avoid erroneous detection of a ground fault situation the audio fault detection system must be capable of discerning a ground fault situation.

Figure 4:
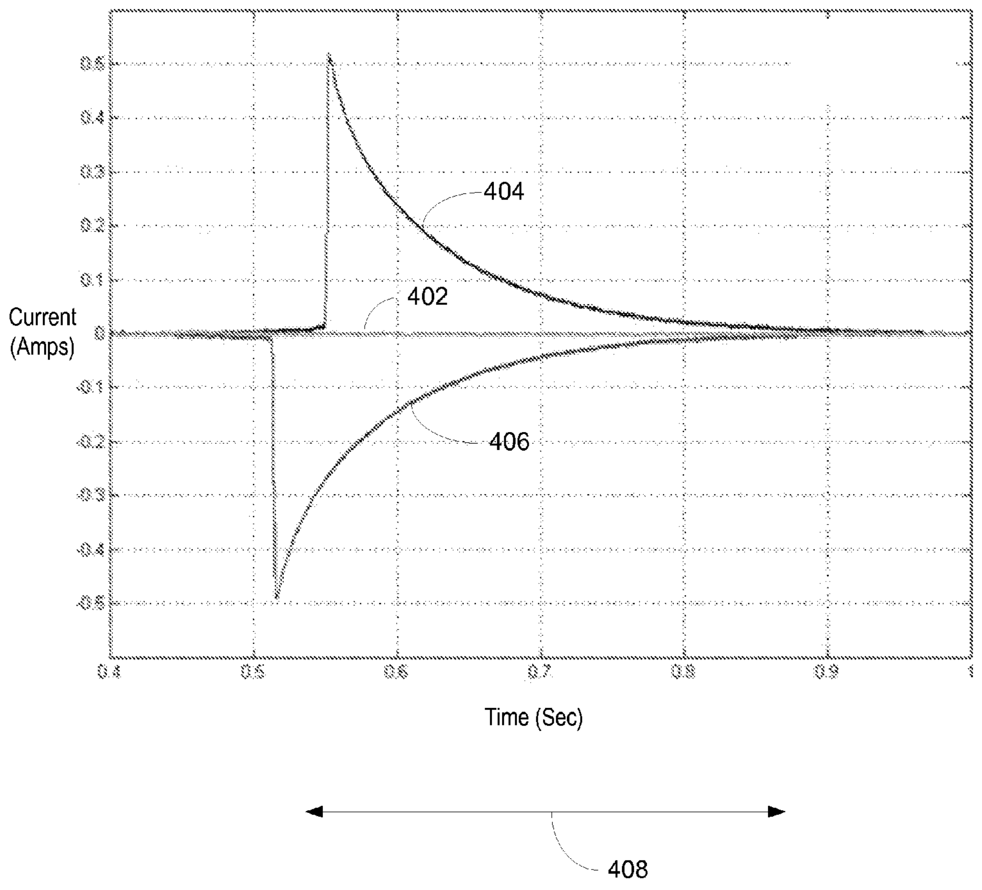
FIG. 4 is a plot of an example short to ground within an example audio system.

FIG. 4 is a plot of a simulated effect of a zero ohm wire short to ground potential on either the positive or the negative side of the output audio channel 136. In FIG. 4, a no AC signal output condition 402 is illustrated as a reference. During the no AC signal output condition 402, there is no audio output signal, short to power source, or short to ground occurring on the output audio channels 136, and the output audio signals remain at quiescent conditions (zero amps) for the illustrated time duration of one second. A positive short impulse 404 illustrates a positive going alternating (AC) electrical current spike to about 0.5 amps occurring about 0.55 seconds after the zero ohm short to ground potential occurs on the positive side of the output audio channel 136. The positive impulse 404 then decays back to zero electrical current at about 0.9 seconds after the zero ohm short to ground potential occurs. A negative short impulse 406 illustrates a negative going AC electrical current spike to about −0.5 amps occurring at about 0.52 seconds after the zero ohm short to ground potential of the negative side of the output audio channel 136. The negative impulse 406 then decays back to zero electrical current at about 0.9 seconds after the zero ohm short to ground potential occurs. The electrical current may occur on the output audio channels 136 as power is applied to the amplifier module 134, such as when the amplifier module 134 comes out of standby mode and applies a predetermined output voltage, such as 250 mV on each of the positive and negative sides of the output audio channels 136. In other examples, the decay rate of the positive and negative impulses 404 and 406 may be different as a result of different inductive and capacitive properties of the audio system.

Accordingly, to detect a short to ground (STG) condition, the processing device 114 can identify an excessive electrical current draw during a monitoring period, such as during startup or operation of the audio system 100. In addition, operational conditions of the audio system 100 can be accounted for by the processing device 114 to avoid incorrect detection and indication of an STG condition by the processing device 114.

One operational condition taken into consideration is the resistance of the loudspeakers 106. The loudspeakers 106 can represent a predetermined resistive load. In some examples, the predetermined resistive load may be as low as 2 ohms. The processing device 114 may detect resistive STG conditions, such as when there is some amount of resistance in the path to ground, without falsely detecting the predetermined resistance of the loudspeakers as being a resistive STG condition. In this regard, the processing device 114 may detect resistive shorts to ground of up to about one ohm.

In another operational condition, the processing device 114 may differentiate between a brief burst of voltage/current that may occur in the audio system during a monitoring period, such as during system startup. Such a brief burst of voltage/current may occur, for example, when one or more of the loudspeakers vibrate due to external conditions, such as during a door slamming event in a vehicle. Vibration of a loudspeaker by an external force, such as due to an abrupt change in air pressure may result in reciprocation of a coil of the loudspeaker 106, which in turn may cause the loudspeaker 106 to resonate at a natural resonant frequency and generate voltage/current. In other examples, any other event, such as processing of audio content, such as music or voice, through the audio system, may cause brief bursts of voltage/current on the output audio channels.

Figure 5:
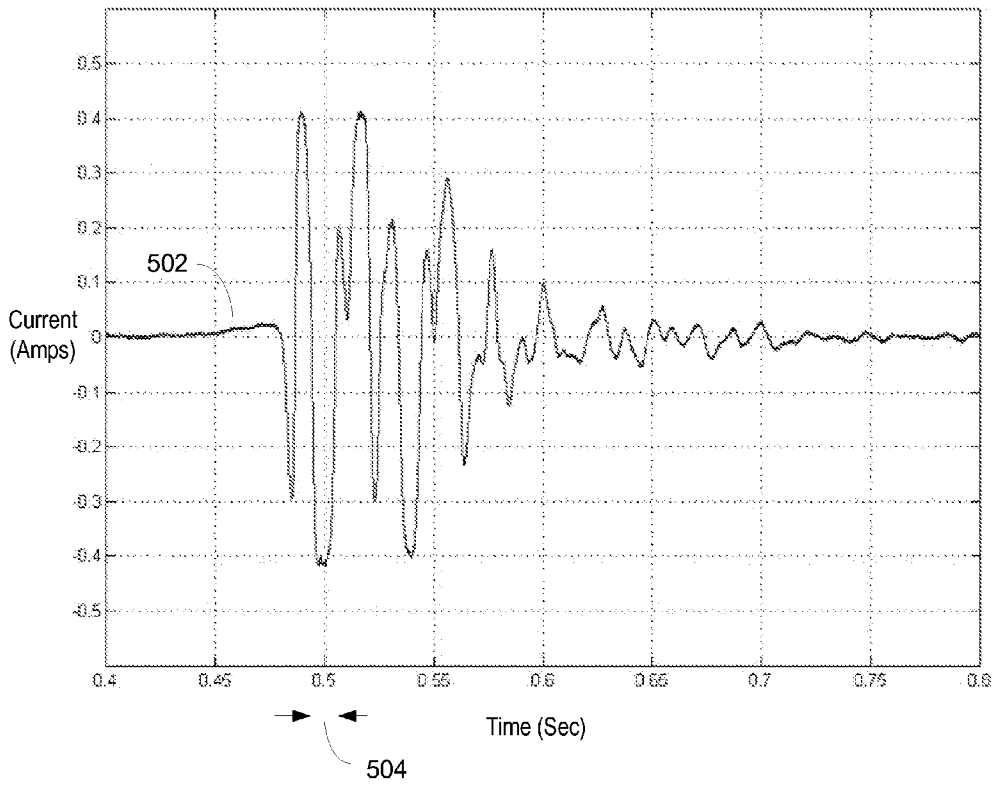
FIG. 5 is a plot of an example electrical current burst event within an example audio system.

FIG. 5 is a plot of an example of a burst of electrical current occurring as a result of a vehicle door closing event for a loudspeaker 106 in which voltage/current is generated. In the example of FIG. 5, generation of an alternating loudspeaker current 502 occurs within about 0.45 seconds after a door is slammed in a vehicle in which the loudspeaker 106 is positioned. The loudspeaker 106 may, for example be positioned in the door being closed, in another door of the vehicle, in a surface of the vehicle such as rear deck or dashboard, or any other location. In this example, a peak amplitude of the electrical current generated by the loudspeaker 106 during the door closing event is about +/−0.4 amps, which is similar to the peak electrical currents of the example positive and negative short to ground potential events illustrated in FIG. 4. However, the loudspeaker electrical current 502 oscillates around a natural frequency creating a number of positive and negative current peaks as the electrical current decays in accordance with the reduction in physical oscillations of the loudspeaker coil until the oscillations, and therefore generation of the loudspeaker electrical current 502 become negligible at about 0.6 seconds after the door slam event. During the door slam event, the AC loudspeaker electrical current 502 experiences a number of zero crossings due to the oscillations at resonance of the loudspeaker.

Thus, in comparing the zero crossings of the STG condition of FIG. 4 to the door slam condition of FIG. 5, the longest duration of electrical current 502 being generated on the output audio channels in which there is no zero crossing during the door slam event is a period 504 of about 60 milliseconds. In FIG. 4, on the other hand, due to the relatively slow decay of the STG event, a period 408 without a zero crossing is about 400 milliseconds. Since the electrical current waveform of FIG. 4 is an exponentially decaying step response of AC electrical current, when an actual STG event occurs, the electrical current signal may not experience a zero crossing until greater than a predetermined period of time, such as about 100 milliseconds, whereas other conditions, such as a door slam event may experience a significant number of zero crossings during the same predetermined period.

Figure 6:
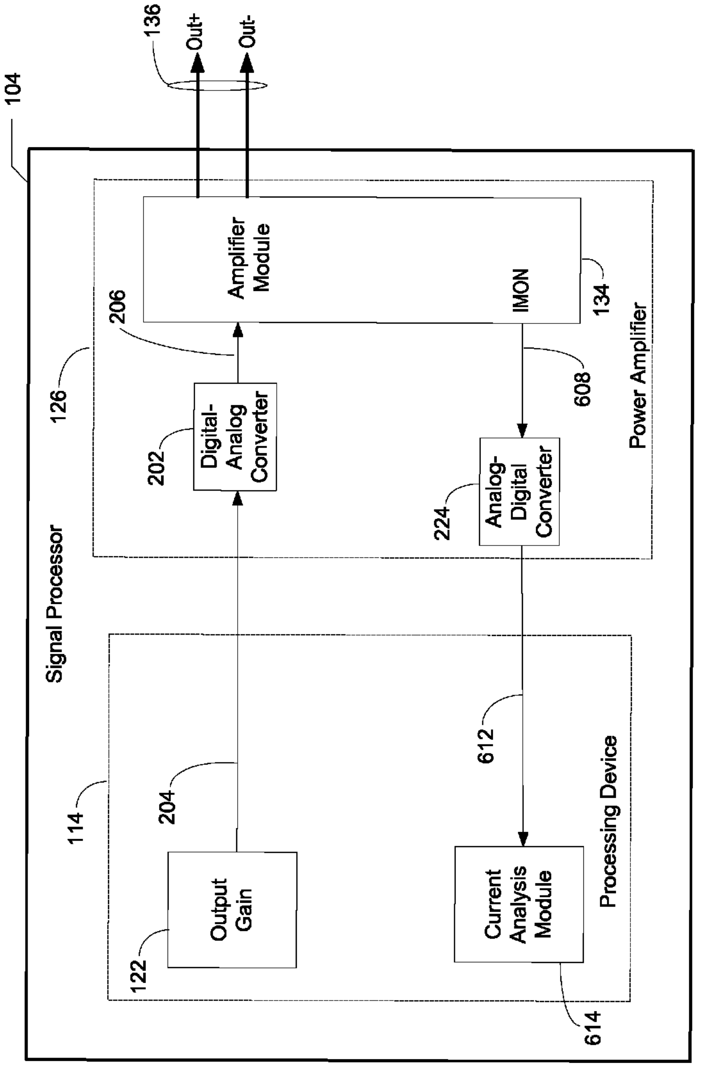
FIG. 6 is a block diagram of another example signal processor that may be included in the audio system of FIG. 1 to perform short to ground diagnostics.

FIG. 6 is a block diagram example of another audio processor 104 that includes a processing device 114 and a power amplifier 126. The processing device 114 may provide a processed audio output signal to a digital-to-analog converter (DAC) 202 on a processed digital audio signal line 206. The DAC 202 may produce an analog processed audio output signal on a power amplifier audio channel input line 206. The DAC 202 may be included in the processing device 114, the power amplifier 126, or may be a separate device. The power amplifier 126 may include a power amplifier module 134. The analog processed audio output signal on the power amplifier audio channel input line 206 may be provided to the power amplifier module 134 for amplification. The power amplifier module 134 may increase the amplitude of the audio output signal by a predetermined fixed or variable amount, and output the amplified audio output signal(s) on the output amplifier channel(s) 136. The output amplifier channel(s) 136 may be configured with a positive audio output (OUT+) and a negative audio output (OUT−).

The power amplifier 126 may also provide a feedback signal, in the form of an electrical current monitor output signal on a feedback signal line 608. The feedback signal may provide an analog electrical current feedback signal to an analog-to-digital converter (ADC) 224. The output of the ADC 224 may be provided as a digital signal to an electrical current analysis module 614 included in the processing device 114 on a digital feedback signal line 612. The ADC 224 may be AC coupled to the amplifier module 134 such that only an AC component of the feedback signal is provided to the electrical current analysis module 614. In one example, the ADC 224 may include an onboard filter, such as a finite impulse response filter, to eliminate any DC components that may be present in the feedback signal, such as in an audio grade ADC. In another example, a capacitor, a filter or any other device may be provided, such as in the electrical current feedback line 608 to eliminate any DC component that may be present in the electrical current feedback signal.

The electrical current feedback signal provided to the electrical current analysis module 614 may provide an indication of the electrical current present on the output audio channels 136. Accordingly, during fault detection diagnostics, the signal processor 114 may use the electrical current feedback signal and the electrical current analysis module 614 during an STG event. The electrical current analysis module 614 may capture electrical current feedback signal data in the form of digital samples of the electrical current feedback signal.

The electrical current analysis module 614 may perform STG diagnostics by analysis of the digital samples of the alternating electrical current of the current feedback signal during a monitoring period, such as during operation or during startup of the audio system, such as when a vehicle is started or the accessory feature is switched on. Part of the startup or operation of the audio system involves the energizing or bringing the power amplifier 126 out of standby mode. In one example, as the power amplifier 126 begins operation, a predetermined voltage, such as 250 mV DC may be output on each of the output audio channels 136, resulting in a single-ended DC electrical current appearing on each of the output audio channels 136 (OUT+ and OUT−). The term "single ended" describes that the DC electrical current that appears on each of OUT+ and OUT− of the output audio channels 136. In the event there is no short to ground potential condition, the DC electrical current is filtered such that digital samples received at the electrical current analysis module 614 are similar to the no AC signal output condition 402 (FIG. 4). Alternatively, if there is a short to ground potential, an AC signal appears on either the OUT+ or OUT of the output audio channels 136 similar to the positive short impulse 404 or the negative short impulse 406. (FIG. 4) In still another alternative, depending on operating conditions, an AC signal may appear on either the OUT+ or OUT− of the output audio channels 136 in the form of a burst of electrical current, such as the alternating loudspeaker electrical current during a door slam event in a vehicle (FIG. 5).

Upon detecting an AC signal on the output audio channels 136 during the STG diagnostics, the electrical current analysis module 614 may determine if the AC signal is a short to ground potential event based on whether the samples of AC signal received by the electrical current analysis module 614 are greater than a predetermined threshold during a predetermined window of time.

In one example, the predetermined threshold may be a value or magnitude of electrical current samples that are greater than a predetermined absolute value (a positive or negative value). The value of the predetermined threshold may be chosen to be outside a magnitude of electrical current drawn by a low resistance loudspeaker, such as a two ohm loudspeaker, but yet low enough of a value to recognize and identify a resistive short to ground, such as a one ohm short to ground, as well as a low or substantially zero impedance short to ground condition in which a higher magnitude of electrical current can flow.

The predetermined window of time may be long enough to avoid detecting a burst of electrical current, such as an electrical current generated by a loudspeaker 106 during a door slam event or by audio content, such as music or speech driving a loudspeaker 106. Thus, in one example, based on the example short to ground potential events of FIG. 4 and the door slam event of FIG. 5, the predetermined period of time may be about 100 milliseconds. In other examples, the predetermined window of time may be longer or shorter dependent on the duration of any expected burst currents and the duration of any expected short to ground electrical currents. In other words, the predetermined window of time may be long enough so that the electrical current analysis module 614 can distinguish between an electrical current developed on the output audio channels 136 during a short to ground potential condition versus a burst of electrical current condition, and the electrical current exceeds the predetermined threshold to distinguish between a ground fault electrical current and electrical current present during startup or operation of a low impedance loudspeaker 106.

The electrical current analysis module 614 may include instructions independently executed by the digital signal processor 116 and the microprocessor 118 (FIG. 1) to perform the STG diagnostics during startup and/or operation of the audio system. The digital signal processor 116 and the microprocessor 118 (FIG. 1) may cooperatively operate to efficiently perform the STG diagnostics, with each device performing part of the STG diagnostics functionality. The digital signal processor 116 may perform the sampling of the electrical current samples. Thus, the predetermined period of time may be based on a number of samples. For example, if the digital signal processor 116 operates at a clock speed of 48 kHz, the digital signal processor 116 may capture the number of samples of the electrical current above the predetermined threshold for 4800 samples. The microprocessor 118 may perform the logic to determine if the predetermine threshold has been exceeded during the predetermined period. For example, the microprocessor may confirm that a value of each of the samples is above the predetermined threshold throughout the predetermined period of time. In other examples, the entirety of the STG diagnostics may be performed by only the digital signal processor 116 or the microprocessor 118. In addition, in other examples, counters, current sensors, registers, or any other techniques may be used by the processing device 118 to perform analysis of digital samples in view of the predetermined threshold electrical current and the predetermined period of time.

In one example of the STG diagnostics performed by the electrical current analysis module 614, a zero crossing analysis may also be used during the STG diagnostics in addition to using the predetermined threshold electrical current and the predetermined period of time. A zero crossing is the point in time when an alternating electrical current present on the output audio channels 136 crosses a zero current threshold. Comparing zero current threshold crossings in FIG. 4 to FIG. 5, the short to ground potential events (STG) resulting in the positive short impulse 404 or the negative short impulse 406 do not experience a zero crossing for about 400 milliseconds.

The burst currents generated, such as by audio content, or such as by a loudspeaker 106 as shown in FIG. 5, on the other hand, may experience a zero crossing in 60 milliseconds or less.

In an example test case of a configuration of an audio system, it was determined from test data that the period of time between zero crossings during various types of STG events ranging from a zero impedance short to a one ohm short during different operational conditions was in a range of 143 milliseconds to about 200 milliseconds. In another example test case of the configuration of the audio system, it was determined from test data that the period of time between zero crossings during various burst of electrical current events was in a range of about 0 to about 60 milliseconds. In addition, it was determined that the predetermined threshold of electrical current for both a burst of electrical current event and a short to ground event with a short circuit of one ohm or less was above 0.4 amps. Thus, based on this test case example, the predetermined threshold could be 0.4 amps, the predetermined period of time could be greater than 60 milliseconds, and the predetermined number of zero crossings distinguishing a burst of electrical current event from a short to ground event during the predetermined period of time could be no zero crossings. In other examples, to account for variations in components, temperature and other variables, the predetermined threshold could be 0.2 amps or in a range of 0.1 amps to 0.3 amps, the predetermined period of time could be greater than 100 milliseconds, or in a range of 80 to 120 milliseconds, and the predetermined threshold could be 5 zero crossings, or in a range of 3 to 8 zero crossings, for example. In other examples, other predetermined periods of time and predetermined threshold values may be used.

Referring again to FIG. 1, STG diagnostics, including zero crossing processing, may be performed using both the digital signal processor 116 and the microprocessor 118. The computational strengths of each of the digital signal processor 116 and the microprocessor 118 may be leveraged to perform the STG diagnostics to minimize communication bus traffic and optimize operation of the digital signal processor 116 and the microprocessor 118. In one example, the digital signal processor 116 may perform the sampling, and operate a maximum zero crossing counter 142, a local zero crossing counter 144, and the microprocessor 118 may perform accompanying logic 146 used in data analysis to determine if a short to ground event occurs. The logic 146 may be stored in the memory 110.

In one example, the maximum and local zero crossing counters 142 and 144 may each also include a respective maximum and local zero crossing counter register that can be updated for each sample processed. In this example, the local zero crossing counter 144 may be incremented when a zero crossing of the digital crossing electrical current samples is detected by the digital signal processor 116, and the maximum zero crossings counter 142 may count the total number of samples. Thus, the maximum zero crossing counter 144 can include a count of the number of digital samples processed during an electrical current event, and the local zero crossing counter 142 may indicate the number of zero crossings during the electrical current event.

In another example, the maximum zero crossing counter 144 may store a value of the maximum number of samples with a positive or negative magnitude of electrical current that exceeds the predetermined threshold value that occur between zero crossings, whereas the local zero crossing counter 142 may store a count value of the number of samples since the last zero crossing, that may be reset to zero whenever a zero crossing of the digital electrical current samples is detected by the digital signal processor 116. Thus, in this example, the maximum zero crossing counter 144 can maintain a maximum number of samples processed between zero crossings, and the local zero crossing counter 142 may indicate the number of digital samples that have been processed since the last zero crossing was detected. In other examples, the counters may be included in the microprocessor 118, and the digital signal processor 118, or any other processor included in the processing device 114.

Detection of the zero crossings may be performed based on analysis of the digital samples. In one example, the digital signal processor 116 may perform a zero crossing calculation for each new sample:

$$\text{New Sample (NS)} \times \text{Previous Sample (PS)} = \text{Result (R)} \qquad \text{Equation 1}$$

where NS is a just received electrical current sample of the alternating electrical current present on one of the output audio channels 136, and the PS is a previously received electrical current sample, such as the electrical sample received just prior to the NS. Since the digital samples will be positive for positive electrical current and negative for a negative electrical current samples, the digital signal processor 116 can reset the local zero crossing counter 142 whenever R changes sign. Thus, so long as R remains +R, the digital signal processor 116 will not register a zero crossing, and/or reset the local zero crossing counter 142, however, when +R becomes −R, the local zero crossing counter 142 can be incremented and the register is updated, or is reset and the register is zeroed. The maximum zero crossing counter 144 may be incremented each time a digital sample is processed with a magnitude of electrical current outside the predetermined threshold, or when the value in the local zero crossing counter 142 exceeds the value presently stored in the maximum zero crossing counter. In this way, the digital signal processor 116 may perform sample-by-sample zero crossing analysis and store an indication of the number of zero crossings and the number of samples processed that exceed a predetermined threshold, and/or a maximum number of samples that have been processed between any number of zero crossings.

In addition to using the predetermined threshold and the predetermined period of time to identify a short to ground event, the microprocessor 118 may also perform zero crossing based STG analysis. The additional zero crossing analysis may be used to further determine if the event is a short to ground, or a burst electrical current. In one example, this may involve determining if the zero crossing count of the zero crossing counter exceeds a predetermined zero crossing count value within the predetermined period of time while the predetermined threshold is being exceeded. In another example, this may involve determining if the number of samples, or a predetermined time, between zero crossings exceeds a predetermined maximum number while the predetermined threshold is being exceeded.

In one example, the digital signal processor 116 may buffer a maximum number of zero crossings in the local zero crossings counter 142, and the total number of samples in the maximum zero crossings counter 144, and the microprocessor 118 may check if a predetermined maximum number of zero crossings (predetermined value) has been exceeded after a predetermined period of time indicated by the number of samples (delay following commencement of the electrical current event). In another example, the microprocessor 118 may monitor for a reset of the zero crossing counter 144, or a count of a number of zero crossings, while the feedback electrical current is above the predetermined threshold, and determine if a period of time since the last time (or a determined number of times) the zero crossing counter was reset exceeds the predetermined period.

In another example, the digital signal processor 116 may store the number of samples between zero crossings that are outside the predetermined threshold in the local zero crossing counter 142, and buffer the maximum number of samples outside the threshold between zero crossings in the maximum zero crossings counter 144. In this example, the microprocessor 118 may check if a predetermined maximum number of samples between zero crossings (predetermined value) has been exceeded.

Thus, in the example of occurrence of a burst of electrical current using the previously discussed testing example, zero crossing counts could be added at a maximum of every 60 milliseconds, or 2880 samples with a 48 kHz sample frequency, whereas in the example of occurrence of a short to ground event, zero crossing counts could be added at a minimum of every 143 milliseconds, or 6864 samples. In other words, in the example of occurrence of a burst of electrical current using the previously discussed testing example, the samples between zero crossings could be a maximum of every 60 milliseconds, or 2880 samples with a 48 kHz sample frequency, whereas in the example of occurrence of a short to ground event, the samples between zero crossings could be at a minimum of every 143 milliseconds, or 6864 samples.

In still other examples, the microprocessor 118 could receive a count of the number of samples from the digital signal processor 116, and monitor zero crossing counter 142 to be reset, or check for a change in the number of zero crossings present in the zero crossings counter 142 at a predetermined number of samples, such as when 2880 or 6864 samples were reached. In still other examples, any other logic could be performed by the microprocessor 118 in any other way to establish an STG event using the local and/or maximum zero crossing counters 142 and/or 144, the predetermined threshold, and/or the predetermined period of time. In addition, in still other examples, any other form of cooperative operation between the digital signal processor 116 and the microprocessor 118 may be implemented to determine an STG event using at least one of the local zero crossing counter 142, the maximum zero crossing counter 144, the predetermined threshold, and the predetermined period of time. If the local and maximum zero crossing counters 142 and 144 or the sample counter are running all the time the audio system is operating, the local and maximum zero crossing counters 142 and 144 and/or the sample counter may be reset, or a value may be logged at the commencement of startup of the power amplifier 126 and/or when STG diagnostics are initiated.

Figure 7:
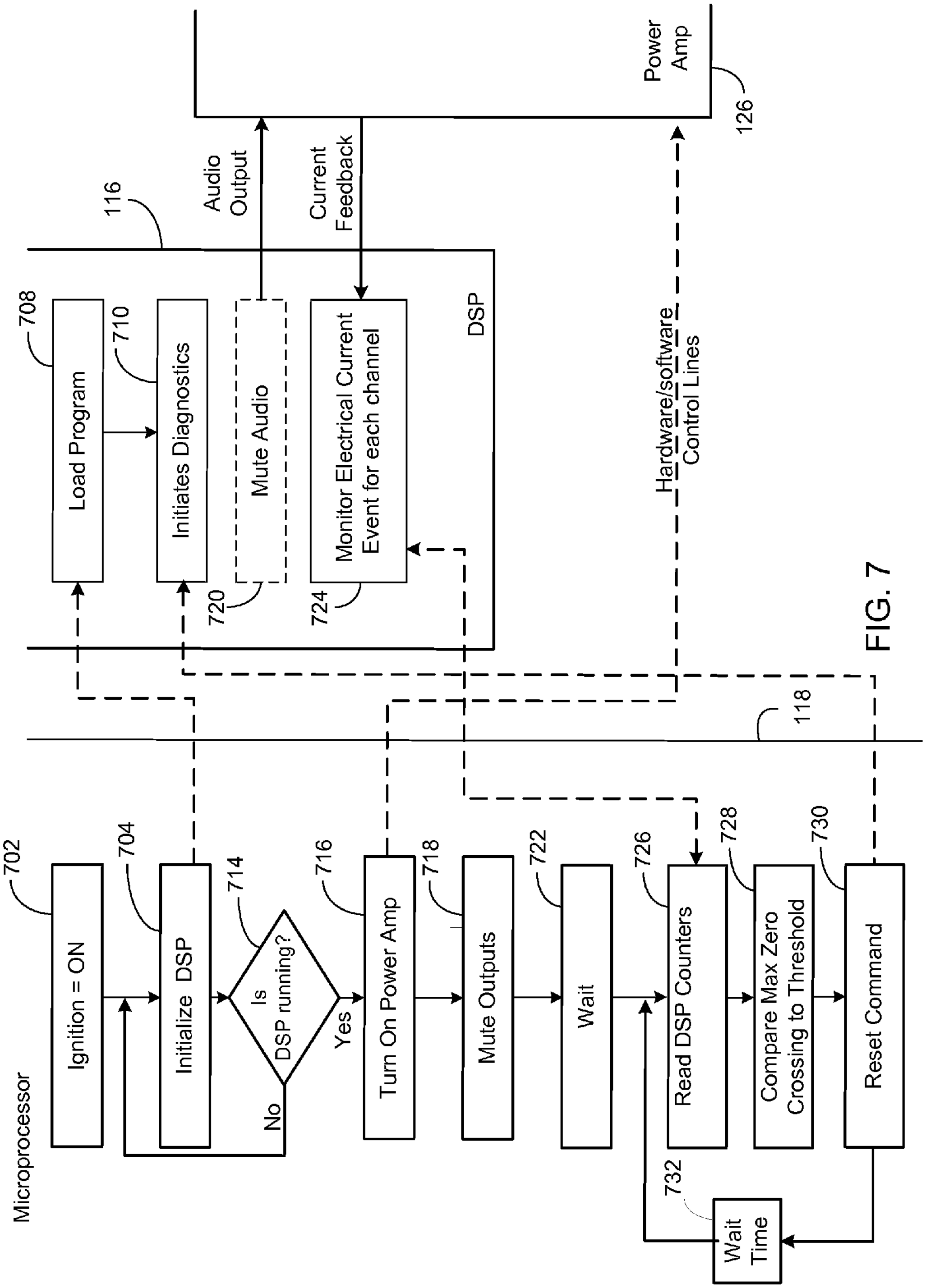
FIG. 7 is an example operational block diagram of the signal processor of FIG. 6.

FIG. 7 is an example operational block diagram that includes the microprocessor 118, the digital signal processor (DSP) 118, and the power amplifier 126, and illustrates an example distribution of the functionality of the STG diagnostics between the microprocessor 118 and the DSP 116. In FIG. 7, operation begins at block 702 when the audio system is energized, such as when an ignition switch of a vehicle is changed to an "on" position to start the vehicle or enter an accessory mode. In other examples, any other condition may trigger the operation, such as a predetermined time or event that occurs, while the audio system is operating to process audio content, such as music or voice. The ignition on event may be sensed by the microprocessor 118 at block 702. At block 704, the microprocessor 118 generates and transmits an initialization message to the DSP 116. Communication between the microprocessor 118 and the DSP 116 may be over a control line, a dedicated bus, a bus network, such as a CAN bus or a MOST bus, or via any other communication path, and may include hardware and/or software. Alternatively, the microprocessor 118 and the DSP 116 may be a single device, or multiple devices of the same device type cooperatively operating. In the case of a single device, the initialization message could be a software event, such as a flag, a register, a variable, or any other notification mechanism.

Upon receipt of the initialization message, the DSP 116 initiates operation and loads program instructions, including the STG diagnostics functionality at block 708. The DSP 116 initiates diagnostics, such as by clearing stored DSP variables from memory at block 710. Clearing of stored variables may include resetting registers and counters, such as a sample counter register, and the local and maximum zero crossing counter registers. Alternatively, clearing stored variables may be identifying values present in the registers and counters as starting values, rather than zeroing the registers and counters. At startup, the microprocessor 118 communicates with the DSP 116 to confirm the DSP is running at block 714. Upon completion of startup of the DSP 116, the DSP 116 may communicate to the microprocessor 118 that startup was successfully completed, or the microprocessor 118 may query the DSP 116 to confirm startup was completed successfully. If the DSP 116 is not running, the operation returns to block 704 and the microprocessor 118 re-transmits the initialization message to the DSP 116. In other examples, the DSP 116 may initialize the microprocessor 118.

If, at block 714, the DSP 116 is running, the microprocessor 118 transmits an energization message to the power amplifier 126 at block 716. Communication between the microprocessor 118 and the power amplifier 126 may be over a control line, a dedicated bus, a bus network, such as a CAN bus or a MOST bus, or via any other communication path that may include hardware and/or software. Upon receiving the energization message, the power amplifier 126 may startup, emerge from a standby state, or otherwise supply a predetermined voltage on the output audio channels. In other examples, the power amplifier 126 may be started up by the DSP 116, or any other device, or may already be energized and in operation. At block 718, the microprocessor 118 may communicate instructions to the DSP 116 to mute the audio signals being provided as output audio signals to the power amplifier 126. The DSP 116 may mute, turn off, or otherwise disable output of processed audio signals by the processing device 114 to the power amplifier 126 at block 720 such that the power amplifier 126 is no longer performing amplification of audio signals. In other examples, such as during operation of the audio system, the muting of the processed audio signals may be omitted as part of the operation of the STG diagnostics, and the STG diagnostics may be performed while audio content is being output by the audio system.

At block 722, the microprocessor 118 may delay taking any activity, and await further processing by the DSP 116. The microprocessor 118 may, for example, wait until the power amplifier 126, such as a power IC, is fully biased (account for worst-case stack ups). The DSP 116 may process samples of the electrical current feedback signal to monitor the output audio channels for occurrence of an electrical current event for each channel at block 724.

Figure 8:
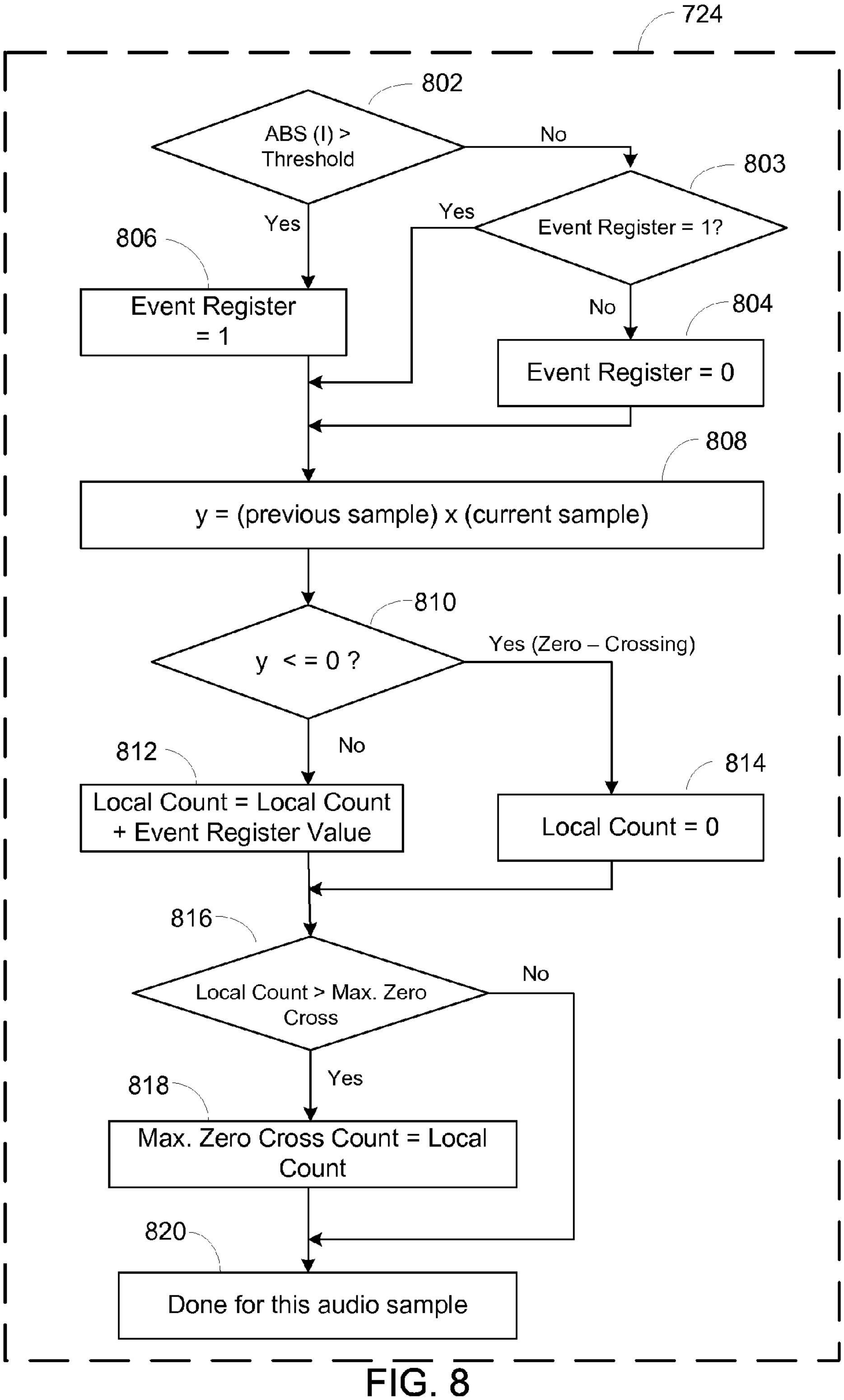
FIG. 8 is an operational flow diagram describing example operation of a digital signal processor included in the signal processor of FIG. 6.

FIG. 8 is an example flow diagram of the processing of a digital sample by the DSP 116 during monitoring of the output audio channels for an electrical current event using the electrical current feedback signal as described in block 724. (FIG. 7) In FIG. 8, the DSP 116 may monitor the electrical current on the feedback current line 612 (FIG. 6), and determine if the absolute value of the electrical current (I) of the sample for an audio channel is greater than a predetermined start threshold electrical current, which in one example can be 0.4 amps. The predetermined start threshold electrical current may be any predetermined value that is greater than 0.2 amps to indicate that there is a new electrical current event present on the output audio channels. Accordingly, the electrical current on the output audio channels exceeding the predetermined threshold provides a start time of the predetermined period of time within which STG diagnostics are performed for a series of electrical current samples. If the electrical current (I) is not greater than the starting threshold electrical current, it is determined if an event register is equal to one at block 803. If at block 803, the event register is not set equal to one, the event register remains set equal to zero. If, on the other hand, the electrical current (I) of the present sample is greater than the predetermined threshold electrical current, at block 806 the event register is set equal to one indicating an event is occurring that could be subject to the STG diagnostics. Thus, as alternating electrical current samples are being processed by the DSP 116, and an event occurs, the event register may indicate the event and not be reset until diagnostics are again initiated (block 710 of FIG. 7). Since sampling by the DSP 116 occurs at a predetermined frequency, such as 48 kHz, the maximum number of samples may be used to determine the maximum time between zero crossings In addition, at block 808, the DSP 116 may perform zero crossing analysis using Equation 1 to multiply the current sample times the previous sample to obtain an output (y). It is determined if the output (y) is less than or equal to zero at block 810. As previously discussed, the output (y) will be positive when the previous sample and the current sample are both negative, or both positive, thereby indicating that no zero crossing has occurred. However, upon output (y) being a negative value, it is indicated that there was a transition between a positive electrical current and a negative electrical current between the current sample and the previous sample. In other words, a zero crossing has occurred between the previous sample and the current sample. If a zero crossing has not occurred based on output (y) being positive, the local zero crossing counter is incremented at block 812 by the value of the event register, which will be set to either a “1” or a “0” depending on whether an event is occurring. By incrementing the local zero crossing counter using the value of the event register, the local zero crossing counter will not increment unless an event is occurring (event register set=“1”). If, on the other hand, a zero crossing has occurred, and output (y) is negative, the local zero crossing counter is zeroed at block 814.

At block 816, it is determined if the local count value stored in the local zero crossing counter is greater than a maximum zero crossing count value stored in the maximum zero crossing counter. If the local count value is greater than the maximum zero crossing count value, the maximum zero crossing count value is set equal to the local count value at block 818, and the processing of the sample is complete at block 820. If, on the other hand, the maximum zero crossing count value is greater than the local count value at block 816, the processing of the sample is complete at block 820 without changing the maximum zero crossing count value. The local count value is incremented for each digital sample, whereas the maximum zero crossing counter represents only the largest number of samples that have been processed without occurrence of a zero crossing for a respective audio channel. Accordingly, in this example, the DSP 116 counts and stores 1) the current number of samples in the local zero crossing counter 142 since the last zero crossing occurrence; and 2) a maximum number of samples between zero crossings, which is stored in the maximum zero crossing counter 144. Alternatively, as previously discussed, the DSP 116 may store 1) the total number of samples in maximum zero crossing counter 144; 2) whether a sample indicates a zero crossing; and/or 3) the total number of zero crossings.

The sample processing by the DSP 116 may occur continuously during operation of the audio system. Thus, STG diagnostics may occur at startup, or anytime during operation of the audio system. STG diagnostics may occur whenever the initiate diagnostics operation occurs. (Block 710, FIG. 7) In addition, STG diagnostics may be performed on one or multiple output audio channels in series or in parallel. In the case of multiple output audio channels, the DSP 116 may include local registers and maximum zero crossing registers that accumulate values separately for each of the corresponding output audio channels. Thus, each of the output audio channels that undergo STG diagnostics can have a local register and a maximum zero crossing register with accumulated values during the STG diagnostic event. For example, in the case of an integrated circuit power amplifier that includes two or four channels providing amplified audio signals on output audio channels, the STG diagnostics can be performed in parallel for the two or four channels.

Referring again to FIG. 7, at block 726, the microprocessor 118 may read the counters and other data from the DSP 116, including the local zero crossing register and/or the maximum zero crossing register for each of the one or more output audio channels. The registers may be read by the microprocessor 118 after a predetermined number of samples, at the conclusion of the predetermined period of time, periodically during the startup, or upon any other trigger or timed event during the startup or operation of the power amplifier 126. In this example, the maximum zero crossing counter register may include the maximum number of samples between zero crossings that occurred during a period of time when the absolute value of the current is above the predetermined threshold current. Alternatively, or in addition, the maximum zero crossing counter register may include the maximum count of zero crossings that occurred during the predetermined period of time represented by the sample counter register. The microprocessor 118 may compare the count of the maximum number of samples between zero crossings (during the predetermined period of time) to a predetermined threshold at block 726. The predetermined threshold may be stored in memory 110, and the predetermined period of time may be represented by, or determined based on, the number of samples in the sample count register.

Figure 9:
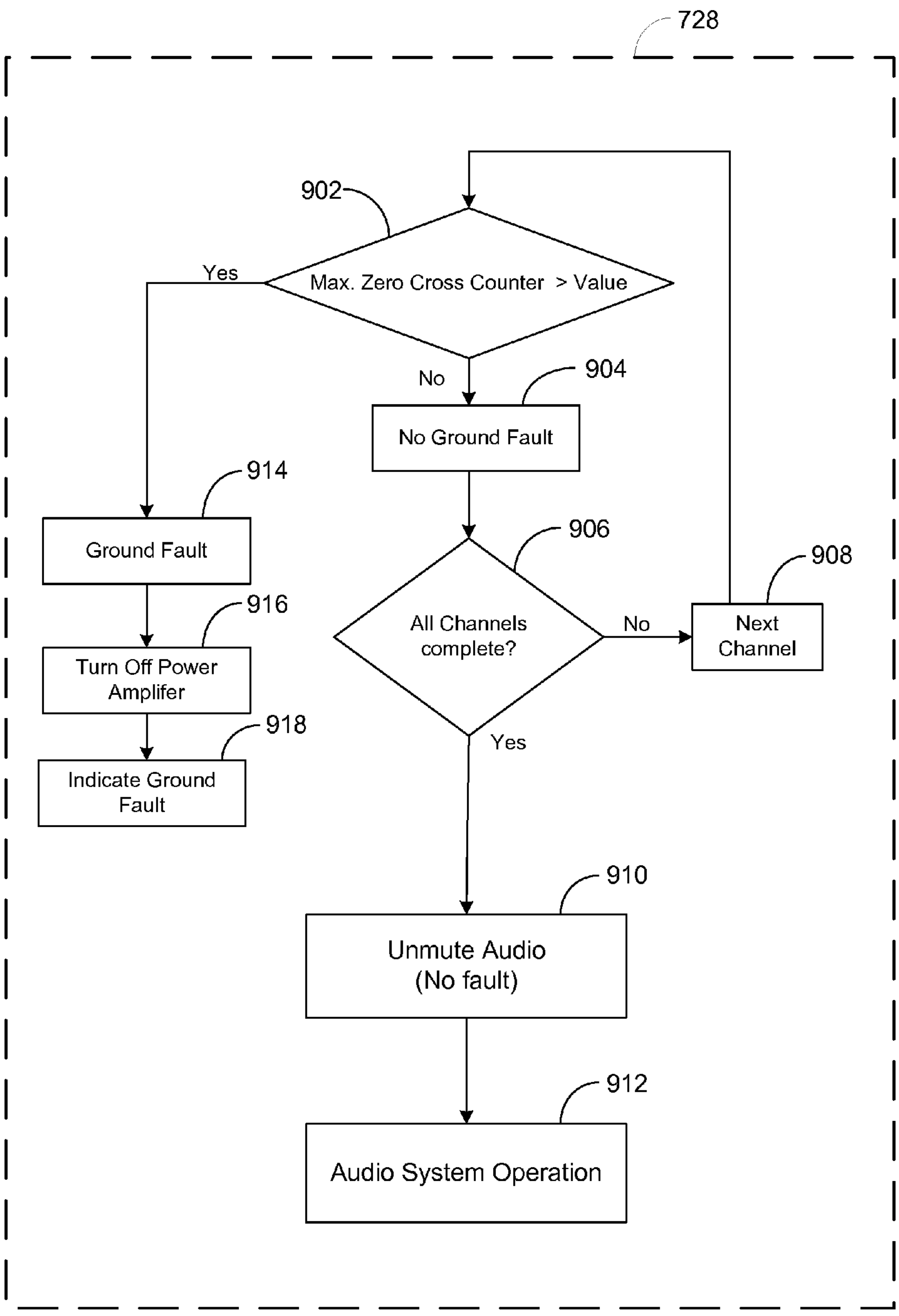
FIG. 9 is an operational flow diagram describing example operation of a microprocessor included in the signal processor of FIG. 6.

FIG. 9 is an example flow diagram of the logic operations of the microprocessor 118 during comparison of the maximum zero crossings count to the predetermined threshold. In FIG. 9, the microprocessor 118 determines if the maximum zero crossing count value is greater than a predetermined maximum zero crossing count value for an audio channel at block 902. In one example, a number of samples in the maximum zero crossings counter representing a maximum period of time between zero crossings is compared to a predetermined number of samples representing the predetermined period of time. In another example, the number of zero crossings during a predetermined period of time represented by a corresponding number of samples in the maximum zero crossing counter (a period of time) is compared to the predetermined number of samples representing the predetermined period of time. In the case of the maximum zero crossing value representing the maximum time between zero crossings, if the maximum zero crossing count value is less than the predetermined threshold, the microprocessor 118 may determine there is no ground fault at block 904. In the case of the maximum zero crossing count value being the total number of samples and the local zero count value being the number of zero crossings, if the local zero crossing count value exceeds the predetermined zero crossing count value within the samples representing the predetermined period of time provided by the maximum zero crossing count value, the microprocessor 118 may determine there is no ground fault detected on the corresponding output audio channel at block 904. At block 906, the microprocessor 118 determines if STG diagnostics have been performed for all output audio channels of the power amplifier 126. If STG diagnostics have not yet been performed for all the output audio channels, the microprocessor 118 selects another of the output audio channels at block 908 and returns to block 902 to determine if the maximum zero crossing count value representing samples between zero crossings, or representing the number of samples used with corresponding zero crossing count value, of the select output audio channel exceeds the predetermined threshold. If, on the other hand, at block 906 it is determined that STG diagnostics have been performed on all output audio channels, the microprocessor 118 determines that there are no ground faults present on any output audio channel, and unmutes the processed audio signals at block 910, if during startup. During operation, the operation of block 910 may be omitted. At block 912, the audio system begins (or continues) operation by processing, amplifying and outputting audio content on the output audio channels to drive loudspeakers.

If at block 902, it is determined by the microprocessor 118 for an output audio channel that the electrical current is above the predetermined threshold for the predetermined period of time, and number of samples between zero crossings is greater than the predetermined threshold, or the zero crossing count is less than the predetermined zero crossing count value within the samples representing the predetermined period of time, the microprocessor 118 determines that a ground fault is present on that output audio channel at block 914. At block 916, the microprocessor 118 transmits a de-energize message to the power amplifier 126, and the power amplifier 126 subsequent powers down. The microprocessor 118 then outputs a fault condition alarm, such as a diagnostics failure alarm at block 918. The fault condition alarm may, for example, be transmitted over a communication bus to a user display, and to other devices in the audio system.

Referring again to FIG. 7, at block 730, the microprocessor 118 may initiate a reset in preparation for another diagnostic. The reset may include communicating a message to the digital signal processor 116 to initiate diagnostics (block 710). At block 732, the microprocessor 118 may wait for a predetermined period of time, to allow the digital signal processor 116 to capture and store additional counts in the counters and registers, before the microprocessor 118 returns to block 726 to read the DSP counters and registers. In addition, the predetermined wait time may be set to allow the microprocessor 118 to perform other functions, such as other functions in the audio system, or the signal processor.

In the previously discussed examples, an audio system having a signal processor capable of performing STG diagnostics on any number of audio channels may operate solely in the digital domain. The signal processor may include a DSP executing instructions to perform sampling of digital samples representative of an alternating electrical current signal present on output audio channel(s), and a microprocessor executing instructions to analyze the sampling performed with the DSP. The STG diagnostics may be performed by the cooperative operation of the DSP and microprocessor on any number of output audio channels during a startup phase, or during operation of the signal processor. During the STG diagnostics, a ground fault may be detected within a predetermined period of time using a predetermined threshold. In one example, the STG diagnostics may include an analysis of the time between zero crossings to determine if a ground fault is present based on the predetermined period of time. In another example, the STG diagnostics may include analysis of a number of zero crossings exceeding a predetermined zero crossing count value within the predetermined period of time. The predetermined threshold may be a predetermined absolute value of the AC audio signal, and the predetermined period of time may be based on a predetermined number of samples processed by the DSP. Thus, the signal processor may identify a ground fault on any of a number of different audio channels during startup when an electrical current present on any one of the audio channels exceeds the to predetermined threshold during the predetermined period of time. In addition, the signal processor may identify a ground fault on any of a number of different audio channels during operation and during startup when a number of samples between zero crossings on any one of the audio channels exceeds a predetermined threshold value when the predetermined threshold is being exceeded. Alternatively, or in addition, the signal processor may identify a ground fault on any of a number of different audio channels during operation and during startup when a number of zero crossings on any one of the audio channels is less than the predetermined zero crossing value during the predetermined period of time when the predetermined threshold is being exceeded.

In addition to the previously discussed examples, other example configuration and operations are possible. For example, the signal processor may include one or more processors that are the same or are different, and the allocation of the functionality described herein may be distributed among the one or more processors. Also, use of the zero crossings to detect ground faults on the audio output channels using executable code may be performed in different ways, and/or using different numbers and kinds of registers. Thus, while various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. An audio channel fault detection system comprising:

a processing device configured to digitally process audio signals; and a power amplifier coupled with the processing device, the power amplifier configured to amplify audio signals digitally processed by the processing device and output amplified audio signals on an output audio channel to drive a loudspeaker;

the processing device configured to execute instructions to detect a short to ground event based on an amount of samples of alternating electrical current on the output audio channel that have zero crossings being less than a predetermined amount of zero crossings for a predetermined window of time, and the processing device configured to count a number of samples between a first zero crossing and a second zero crossing of the alternating electrical current, the short to ground event detected with the processing device in response to the number of samples being greater than a predetermined number of samples representative of the predetermined window of time.

2. The audio channel fault detection system of claim 1, where the predetermined window of time is about 100 milliseconds or greater.

3. The audio channel fault detection system of claim 1, where the processing device is configured to execute the instructions to detect the short to ground during startup of the power amplifier, the processing device further configured to mute output of digitally processed audio signals to the power amplifier during detection of the short to ground.

4. The audio channel fault detection system of claim 1, where the processing device is configured to execute the instructions to detect the short to ground during startup of the power amplifier or during operation of the power amplifier.

5. The audio channel fault detection system of claim 1, where the processing device includes a digital signal processor, the digital signal processor configured to store a count of a number of zero crossings of the samples of alternating electrical current during the predetermined window of time.

6. The audio channel fault detection system of claim 5, where the processing device further comprises a microprocessor, the microprocessor configured to determine if the count of zero crossings is less than a predetermined maximum number of zero crossings during the predetermined window of time to detect the short to ground event.

7. The audio channel fault detection system of claim 5, where the digital signal processor iteratively multiplies a current sample times a previous sample to obtain a result, and the digital signal processor is configured to increment a zero crossings counter each time the result changes from a positive value to a negative value.

8. The audio channel fault detection system of claim 1, where the processing device includes a digital signal processor, the digital signal processor configured to monitor a count of the number of samples of alternating electrical current that occur sequentially without a zero crossing, and to update a value of a maximum zero crossings counter in response to the value being exceeded by the count.

9. The audio channel fault detection system of claim 1, where the processing device further comprises a microprocessor, the microprocessor configured to determine if the maximum zero crossings counter contains a number of samples that is greater than a predetermined maximum number of samples to detect the short to ground event.

10. A non-transitory computer readable medium that stores instructions executable by a processor to perform audio channel fault detection, the computer readable medium comprising:

instructions executable with the processor to digitally process an audio input signal and generate a digitally processed audio output signal;

instructions executable with the processor to supply the digitally processed audio output signal to a power amplifier used to amplify the digitally processed audio output signal;

instructions executable with the processor to sample an alternating electrical current of the amplified digitally processed audio output signal on an output audio channel of the power amplifier;

instructions executable with the processor to determine if samples of alternating electrical current on the output audio channel have zero crossings for a predetermined period of time;

instructions executable with the processor to indicate a ground fault event has occurred on the output audio channel in response to an amount of the samples of alternating electrical current on the output audio channel that have zero crossings being less than a predetermined amount of zero crossings for the predetermined period of time;

instructions executable with the processor to determine a number of samples between a first zero crossing and a second zero crossing of the alternating electrical current; and instructions executable with the processor to indicate a ground fault event has occurred on the output audio channel in response to the number of samples between the first and second zero crossings being greater than a predetermined number of samples.

11. The computer readable medium of claim 10, where the instructions executable with the processor further comprise instructions to determine a maximum number of digital samples that are between zero crossings of the alternating electrical current on the output audio channel, and determine if the maximum number of digital samples exceeds the predetermined period of time.

12. The computer readable medium of claim 11, where the instructions executable with the processor further comprises instructions to reset a count of the number of the samples between each zero crossing in response to a zero crossing, and instructions executable with the processor update a value of a maximum zero crossing counter with the count in response to the count being greater than the value.

13. The computer readable medium of claim 10, where the instructions executable with the processor further comprise instructions to store a count of the number of zero crossings of the alternating electrical current on the output audio channel during the predetermined period of time that the predetermined threshold is being exceeded.

14. The computer readable medium of claim 13, where the instructions executable with the processor further comprise instructions to indicate the ground fault event has occurred in response to the stored count of the number of zero crossings being less than a predetermined number of zero crossings at a conclusion of the predetermined period of time.

15. The computer readable medium of claim 10, where the instructions executable with the processor further comprises instructions executable with the processor to increment a zero crossing register each time a zero crossing is detected among the samples of alternating electrical current, and instructions executable with the processor to indicate the ground fault event in response to a count of the register being less than a predetermined number after the predetermined period of time.

16. The computer readable medium of claim 10, where the instructions to sample the alternating electrical current on the output audio channel of the power amplifier are configured for execution with a digital signal processor, and the instructions executable to determine if the samples of alternating electrical current on the output audio channel exceed the predetermined value for the predetermined period of time are configured for execution with a microprocessor, the computer readable medium further comprising instructions executable with the digital signal processor and the microprocessor to communicate therebetween over a communication bus.

17. A method of performing audio channel fault detection, the method comprising:

energizing a power amplifier;

digitally sampling a feedback electrical current of the power amplifier, the feedback electrical current indicative of an electrical current present on an output audio channel of the power amplifier;

determining a number of samples between zero crossings of the feedback electrical current; and identifying a ground fault condition in response to the number of samples between zero crossings being greater than a predetermined value.

18. The method of claim 17, where determining the number of samples between zero crossings comprises initiating a count of the number of samples in response to the feedback electrical current going outside a predetermined threshold.

19. The method of claim 17, where determining a number of samples between zero crossings comprises multiplying an electrical current sample by a previous sample, and resetting a count of the number of samples between zero crossings each time a result of the multiplication is a negative value.

20. The method of claim 19, where resetting a count of the number of samples between zero crossings further comprises updating a maximum zero crossings counter to include the count when a value of the maximum zero crossing counter is less than the count, and comparing the value to the predetermined value to identify the ground fault condition.

21. The method of claim 17, where digitally sampling a feedback electrical current of the power amplifier comprises independently sampling the feedback electrical current of the power amplifier for each of a plurality of output audio channels, the feedback electrical current for each of the plurality of audio output channels indicative of the respective electrical current present on each of the output audio channels of the power amplifier.

* * * * *